United States Patent
Karhade et al.

(10) Patent No.: US 11,616,283 B2
(45) Date of Patent: Mar. 28, 2023

(54) 5G MMWAVE ANTENNA ARCHITECTURE WITH THERMAL MANAGEMENT

(71) Applicant: Intel Corporation, Santa Clara, CA (US)

(72) Inventors: Omkar Karhade, Chandler, AZ (US); William J. Lambert, Chandler, AZ (US); Xiaoqian Li, Chandler, AZ (US); Sidharth Dalmia, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1037 days.

(21) Appl. No.: 16/122,609

(22) Filed: Sep. 5, 2018

(65) Prior Publication Data

US 2020/0076046 A1 Mar. 5, 2020

(51) Int. Cl.
| | |
|---|---|
| *H01Q 1/22* | (2006.01) |
| *H03F 3/195* | (2006.01) |
| *H03F 3/24* | (2006.01) |
| *H01Q 1/02* | (2006.01) |
| *H05K 1/03* | (2006.01) |

(52) U.S. Cl.
CPC ............ *H01Q 1/02* (2013.01); *H01Q 1/22* (2013.01); *H01Q 1/2283* (2013.01); *H03F 3/195* (2013.01); *H03F 3/24* (2013.01); *H03F 3/245* (2013.01); *H05K 1/0393* (2013.01)

(58) Field of Classification Search
CPC .......... H01Q 1/02; H01Q 1/2283; H01Q 1/22; H03F 3/195; H03F 33/245; H03F 3/24; H05K 1/0393

USPC ......................................................... 343/702
See application file for complete search history.

(56) References Cited

U.S. PATENT DOCUMENTS

| | | | |
|---|---|---|---|
| 10,070,524 B2* | 9/2018 | Ma | H01L 21/486 |
| 10,440,813 B1* | 10/2019 | Li | H01L 23/36 |
| 2011/0147920 A1* | 6/2011 | Choudhury | H01L 23/3677 |
| | | | 438/122 |
| 2014/0035097 A1* | 2/2014 | Lin | H01L 23/66 |
| | | | 257/E29.325 |
| 2015/0078482 A1* | 3/2015 | Xu | H03F 3/24 |
| | | | 330/277 |
| 2016/0049723 A1* | 2/2016 | Baks | H01Q 13/10 |
| | | | 343/848 |
| 2017/0040266 A1* | 2/2017 | Lin | H01L 23/5385 |
| 2018/0342472 A1* | 11/2018 | Dogiamis | H01L 25/18 |
| 2019/0140361 A1* | 5/2019 | Labonte | H01L 23/49816 |
| 2019/0305402 A1* | 10/2019 | Dalmia | H01L 23/58 |

* cited by examiner

*Primary Examiner* — Hai V Tran
(74) *Attorney, Agent, or Firm* — Schwabe, Williamson & Wyatt, P.C.

(57) ABSTRACT

Embodiments include an electronic package that includes a radio frequency (RF) front end. In an embodiment, the RF front end may comprise a package substrate and a first die attached to a first surface of the package substrate. In an embodiment, the first die may include CMOS components. In an embodiment, the RF front end may further comprise a second die attached to the first surface of the package substrate. In an embodiment, the second die may comprise amplification circuitry. In an embodiment, the RF front end may further comprise an antenna attached to a second surface of the package substrate. In an embodiment, the second surface is opposite from the first surface.

9 Claims, 7 Drawing Sheets

5G MMWAVE ANTENNA ARCHITECTURE WITH THERMAL MANAGEMENT

TECHNICAL FIELD

Embodiments of the present disclosure relate to electronics packaging, and more particularly, 5G mmWave antenna architectures with improved thermal management.

BACKGROUND

The communications industry is rapidly moving towards the implementation of 5G communication technologies. In 5G communication architectures the radio frequency (RF) back end module remains similar to what was used in prior communication architectures. However, the move towards 5G has necessitated significant changes to the RF front end module.

For example, increases in power output needed for mmwave communications in combination with small form factors for mobile products has generated a challenging thermal management problem that needs to be solved to enable the implementation of 5G architectures.

EMBODIMENTS OF THE PRESENT DISCLOSURE

Described in embodiments herein are electronic systems for use in 5G communication applications with antenna architectures that provide improved thermal management. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, thermal management in the RF front end module is an issue that needs to be addressed in order to allow for implementation of 5G communication architectures. Particularly, thermal management of the amplification die is needed. Due to form factor and other performance considerations, the amplification die is not positioned in a location where thermal management is easily implemented. An example of an existing architecture of an RF front end module is shown in FIGS. 1A and 1B.

Figure 1A:
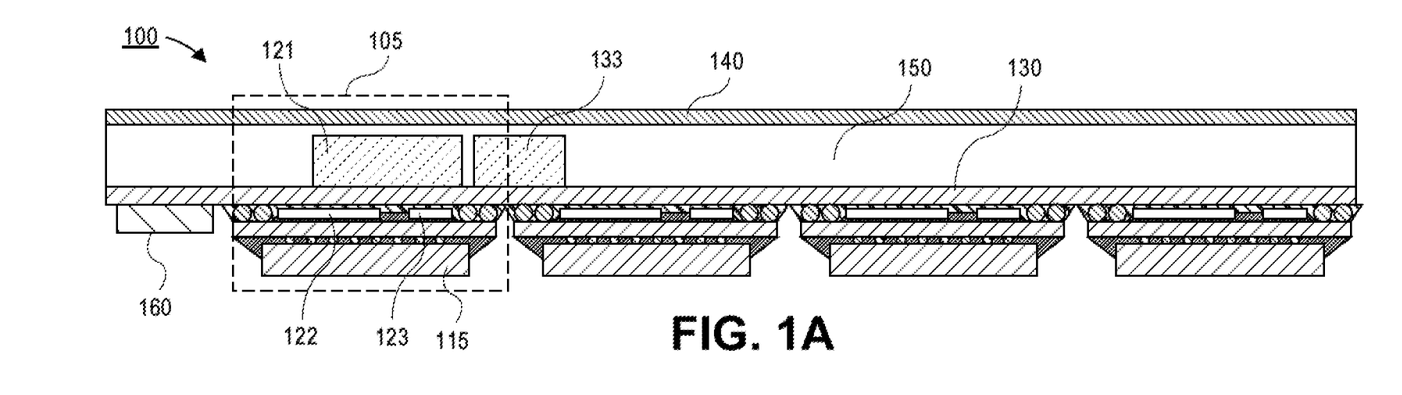
FIG. 1A is a cross-sectional illustration of a radio frequency (RF) front end module.
Figure 1B:
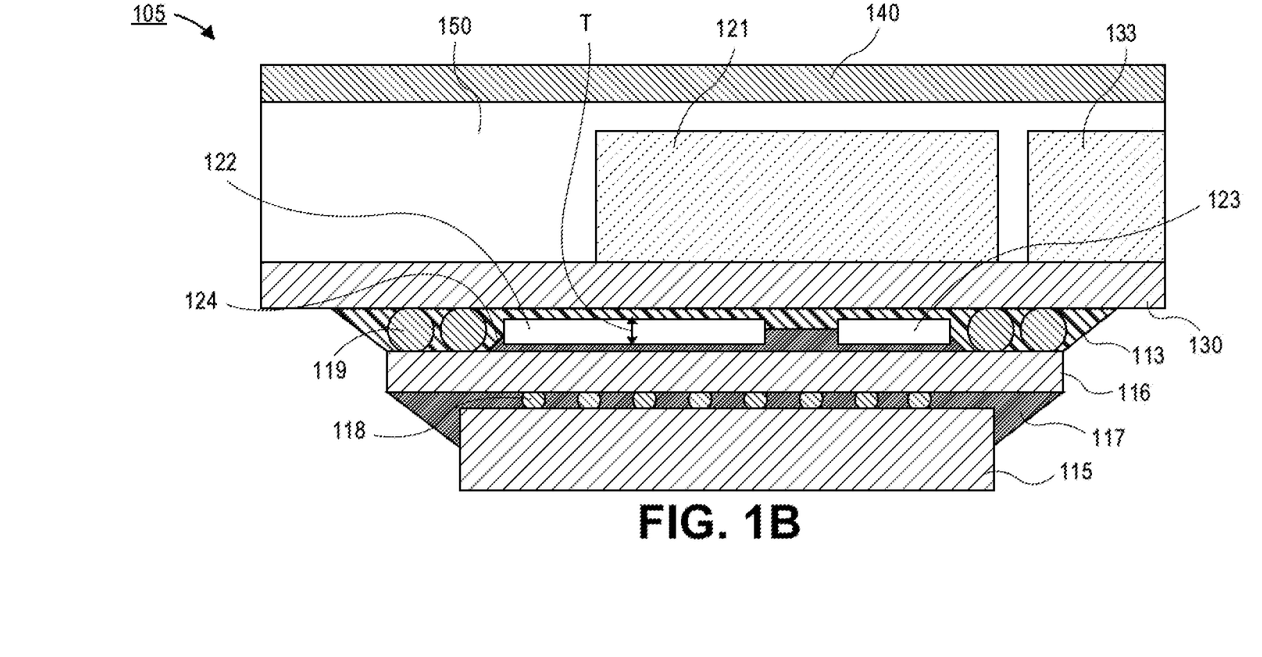
FIG. 1B is a cross-sectional illustration of a portion of the RF front end module in FIG. 1A.

Referring now to FIGS. 1A and 1B, a cross-sectional illustrations of an RF front end module 100 and a zoomed in illustration of a portion 105 of the RF front end module 100 are shown, respectively. The RF front end module 100 may include a main package substrate 130. A first die 121 (e.g., a front end complementary metal-oxide-metal (CMOS) die) may be positioned on a first surface of the main package substrate 130. Additional components 133 (e.g., additional dies, discrete passives, etc.) may also be positioned on the first surface of the main package substrate 130. A connector 160 may be formed on the main package substrate 130 to provide a link back to the transceiver or to the mainboard (not shown).

As shown, the antenna modules 115 may be attached to an intermediate package substrate 116 (e.g., with solder balls 118 and underfill material 117). The intermediate package substrate 116 may be attached to a second surface of the main package substrate 130 (e.g., with solder balls 119 and underfill material 113). The amplification die 122 may be attached to a surface of the intermediate package substrate 116 opposite from the antenna module 115 (e.g., with first level interconnects (not shown) and an underfill material 124). As used herein, an "antenna module" may refer to a substrate with layer thicknesses that correspond to a functional antenna or any other customizable element.

The amplification die 122 and an amplification companion die 123 are positioned proximate to the antenna module 115 in order to minimize losses. However, packaging both the amplification die 122 and the antenna module to the same intermediate package substrate 116 provides manufacturing challenges and results in poor thermal performance.

With respect to thermal performance, there is no direct thermal pathway between the amplification die 122 and the heat spreader 140. Instead, thermal energy must pass through the main package substrate 130 and the mold layer 150, neither of which have high thermal conductivities. Furthermore, the main substrate package 130 and the mold layer 150 may be relatively thick (e.g., 200 μm and 700 μm thick, respectively), therefore, further reducing the thermal performance. Alternatively thermal energy from the amplification die 122 may pass laterally through the main package substrate 130, which is also not optimal. On the antenna module side, there is no heatsink for the thermal energy since the antenna is exposed to air.

With respect to manufacturing challenges, the thickness T of the amplification die 122 and any companion dies 123 must be relatively small in order to minimize the form factor. Particularly, the thickness T of the amplification die 122 must be less than height of the solder balls 119 that attached the intermediate package 116 to the main package 130 (i.e., the backside surface of the amplification die 122 must be spaced apart from the main package substrate 130). For example, the thickness T of the amplification die 122 may be approximately 80 µm or less. Thin amplification dies 122 are susceptible to wafer cracking and die chipping, thereby reducing yield and increasing cost.

Accordingly, embodiments disclosed herein include an amplification die that is positioned over the same surface of the main package substrate that the front end CMOS die is attached to. Such embodiments allow for improved thermal performance since the amplification die is proximate to the heat spread (or even directly coupled to the heat spreader by a thermal interface material (TIM)). Additionally, moving the amplification die to the first surface of the main package substrate allows for the thickness of the amplification die to be increased. The increased die thickness improves thermal performance and also reduces manufacturing complexity. Furthermore, the overall Z-height of the RF front end module may be decreased since the antenna module may be attached directly to the main package substrate.

It is to be appreciated, that the loss introduced by moving the amplification die away from the antenna module is not significant since the amplification die may be positioned over the antenna module. Furthermore, since the intermediate package substrate does not need to accommodate the antenna module, the intermediate package substrate may be reduced in dimension since only the amplification die and a companion die are packaged to the intermediate package substrate. In such embodiments, the total length of the routing from the amplification die to the antenna module may be only a fraction of a millimeter (i.e., less than 1 mm) longer than the case illustrated in FIG. 1. In some embodiments, the amplification die and the companion die may be attached directly to the main package substrate (and the intermediate package substrate may be omitted). In such embodiments, the amplification die is positioned closer to the antenna module, and the losses are reduced.

Figure 2A:
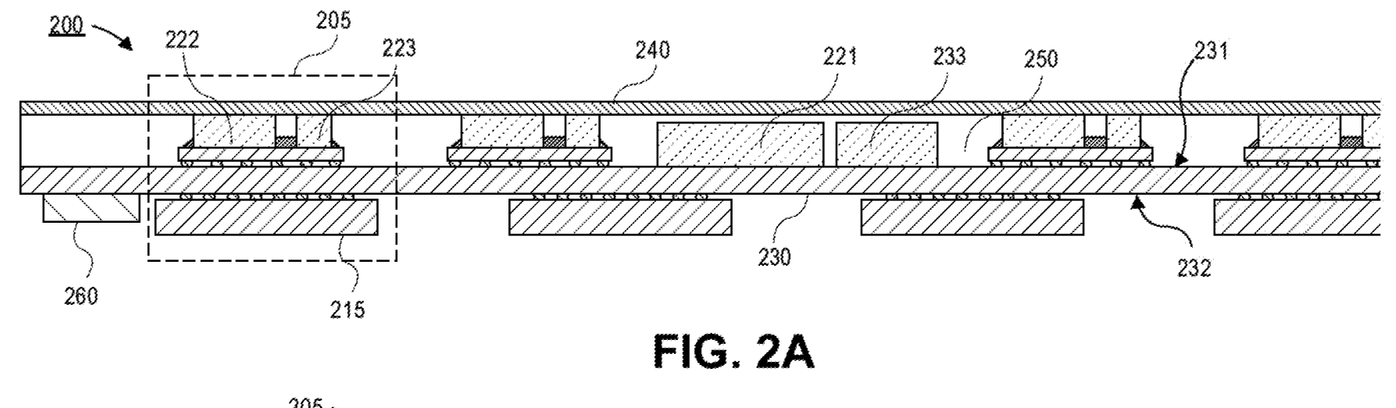
FIG. 2A is a cross-sectional illustration of an RF front end module with an amplifier die attached to a first surface of a second package substrate that is mounted to a first surface of a first package substrate, in accordance with an embodiment.
Figure 2B:
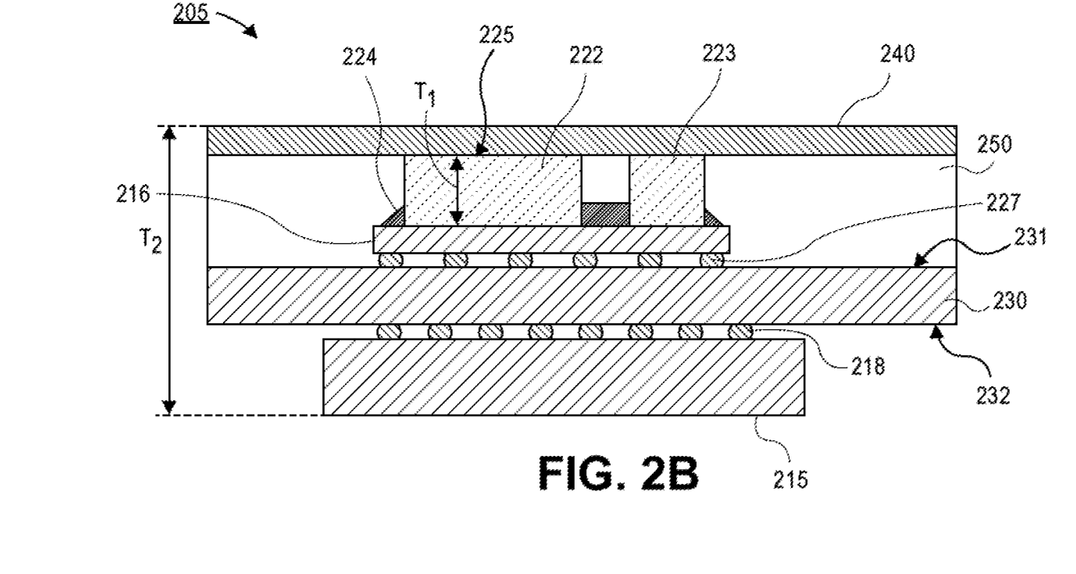
FIG. 2B is a zoomed in cross-sectional illustration of a portion of the RF front end module in FIG. 2A, in accordance with an embodiment.

Referring now to FIGS. 2A and 2B, a cross-sectional illustration of an RF front end module 200 and cross-sectional illustration of a portion 205 of the front end module 200 are shown, respectively, in accordance with an embodiment.

In an embodiment, the front end module 200 may comprise a first package substrate 230 (also referred to as the main package substrate). In an embodiment, the first package substrate 230 may be any suitable organic package. For example, the first package substrate 230 may comprise a plurality of organic build-up layers with or without a core. In an embodiment, the first package substrate 230 may comprise a plurality of conductive traces and vias (not shown) as is known to those skilled in the art.

In an embodiment, an RF front end CMOS die 221 may be attached to a first surface 231 of the first package substrate 230 with first level interconnects (not shown) and an underfill material 224. In an embodiment, the RF front end CMOS die 221 may comprise processing blocks for processing signals in the RF front end. Such processing blocks may include, but are not limited to processing blocks for splitting, combining, mixing, and/or phase shifting signals. In an embodiment, one or more additional components 233 may be attached to the first surface 231 of the first package substrate 230. For example, the one or more additional components 233 may comprise active dies, discrete passives, or the like. In a particular embodiment, the additional component 233 may comprise an inductor.

In an embodiment, a connector 260 may be formed on a second surface 232 of the first package substrate 230. For example, the connector 260 may be a connector suitable for coupling the RF front end module 200 to an RF back end module (not shown) (e.g., by a flexible printed circuit (FPC), a coaxial cable, or the like).

In an embodiment, a mold layer 250 may be formed over the first surface 231 of the first package substrate 230. In an embodiment, the mold layer 250 may be any suitable molding material. For example, the mold layer 250 may be a polymer. In an embodiment, the mold layer 250 may embed the front end CMOS die 221 and the component 233. In an embodiment, one or more of the front end CMOS die 221 and the component 233 may have exposed backside surfaces that interface with a heat spreader 240.

In an embodiment, an amplification die 222 may be attached to the first surface 231 of the first package substrate 230. In the illustrated embodiment, four amplification dies 222 are shown. However, it is to be appreciated that any number of amplification dies 222 may be attached to the first surface 231 of the first substrate 230. For example, the number of amplification dies 222 may match the number of antenna modules 215. In such an embodiment, each of the amplification dies 222 may be communicatively coupled with a different one of the antenna modules 215.

In an embodiment, the amplification die 222 may comprise amplification circuitry and a plurality of switches. In an embodiment, the amplification die 222 may be formed on any suitable semiconductor substrate. In a particular embodiment, the amplification die 222 may be formed on a different semiconductor substrate than the front end CMOS die 221. For example, the front end CMOS die 221 may be a silicon die and the amplification die 222 may be a III-V semiconductor die.

In an embodiment, the amplification dies 222 may each be mounted to a second package 216 by first level interconnects (not shown) and an underfill material 224. In an embodiment, a companion die 223 may also be mounted to the second package 216. In an embodiment, the second package may be attached to the first package substrate 230 with solder balls 227 or any other suitable interconnect architecture. In some embodiments an underfill material (not shown) may be formed around the solder balls 227. In an embodiment, the second package substrate 216 may be any suitable organic package substrate. For example, the second package 216 may include a plurality of build-up layers and conductive traces and vias (not shown).

In an embodiment, the amplification dies 222 may be embedded within the mold layer 250. In some embodiments, the amplification dies 222 include an exposed backside surface 225 that is not covered by the mold layer 250. In such embodiments, the backside surface 225 may be in direct contact with the heat spreader 240. In some embodiments, a TIM (not shown) may be formed over the backside surface 225 to provide improved thermal contact between the heat spreader 240 and the amplification dies 222. As such, thermal performance is greatly improved since the length of the thermal pathway between the amplification dies 222 and the heat spreader is reduced.

Additionally, since the amplification dies 222 are not subject to stringent thickness restrictions, such as in the architecture described above where the amplification die is between the antenna module and the first package substrate, the amplification dies 222 may have a relatively large thickness $T_1$. For example, the thickness $T_1$ of the amplification dies 222 may be approximately 100 µm or greater, 150 µm or greater, or 200 µm or greater. Increasing the thickness $T_1$ of the amplification dies 222 improves the thermal performance and reduces likelihood of chipping or cracking the amplification dies 222.

In an embodiment, the amplification dies 222 and the second package substrate 216 may be positioned above and over the antenna module 215 to which the amplification die 222 is communicatively coupled. Particularly, the amplification die 222 may be within the perimeter of the antenna module 215 (i.e., within the perimeter of the antenna module 215, but at a different Z-height). Providing the amplification die 222 above and over the antenna module 215 provides a short path between the two components and minimizes losses.

In an embodiment, the RF front end module 200 may comprise a plurality of antenna modules 215. While four antenna modules 215 are shown in FIG. 2A, it is to be appreciated that any number of antenna modules 215 may be used, depending on the needs of the device. In an embodiment, the antenna modules 215 may comprise antenna structures suitable for transmitting and/or receiving wireless signals. In a particular embodiment, the antenna modules 215 may comprise antenna structures suitable for transmitting and/or receiving 5G mm-wave signals. In an embodiment, the antenna modules 215 may comprise antennas fabricated with organic build-up layers and conductive traces and vias, as is known in the art.

In an embodiment, the antenna modules 215 may be attached to the second surface 232 of the first package substrate 230 with solder balls 218 or any other suitable interconnect architecture. In an embodiment, an underfill material (not shown) may be formed around the solder balls 218.

In an embodiment, the total package thickness $T_2$ may also be reduced compared to previously described architectures. Instead of having the second package substrate 216 adding to the thickness of the package, the second package substrate 216 and the thickness $T_1$ of the amplification dies 222 is hidden by the thickness of the RF front end CMOS 221 and/or the additional components 233. Accordingly, RF front end modules 200 in accordance with embodiments described herein may have a total thickness $T_2$ that is less than 2 mm or less than 1.8 mm.

Furthermore, it is to be appreciated that decoupling the antenna module 215 from the second package substrate 216 provides additional manufacturing benefits. For example, the amplification die 222 may be packaged onto the second package substrate 216 and tested prior to attachment on the first package substrate 230. Accordingly, only functional packages will be assembled, thereby increasing yield.

Figure 2C:
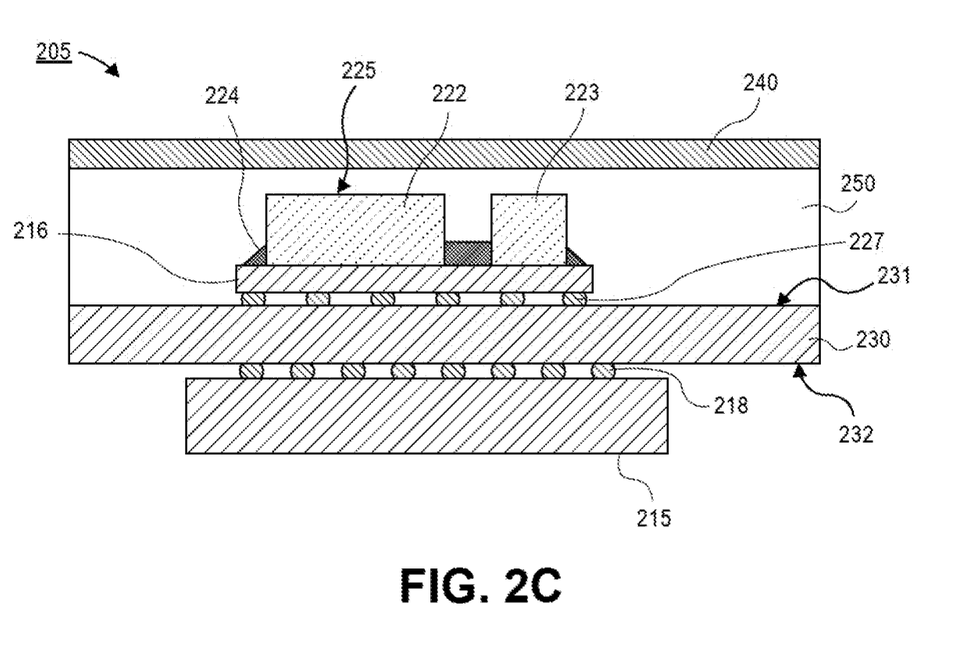
FIG. 2C is a zoomed in cross-sectional illustration of a portion of the RF front end module in FIG. 2A with an overmolded amplifier die, in accordance with an additional embodiment.

Referring now to FIG. 2C, a cross-sectional illustration of portion 205 is shown, in accordance with an additional embodiment. FIG. 2C is substantially similar to FIG. 2B, with the exception that the amplification die 222 is entirely embedded in the mold layer 250. That is, the backside surface 225 of the amplification die 222 is covered by the mold layer 250. While covering the backside surface 225 of the amplification die 222 with the mold layer may slightly decrease the thermal performance, the benefit lies in the simplification of the assembly process. For example, to provide an exposed die backside, the mold layer is formed and then ground back to expose the die backside. The grinding process is an additional process that decreases throughput. Furthermore, the grinding process is complicated with considerations such as warpage, and external pressures that may damage the system. Accordingly, some embodiments may include an over molded amplification die 222, as shown in FIG. 2C.

Figure 3A:
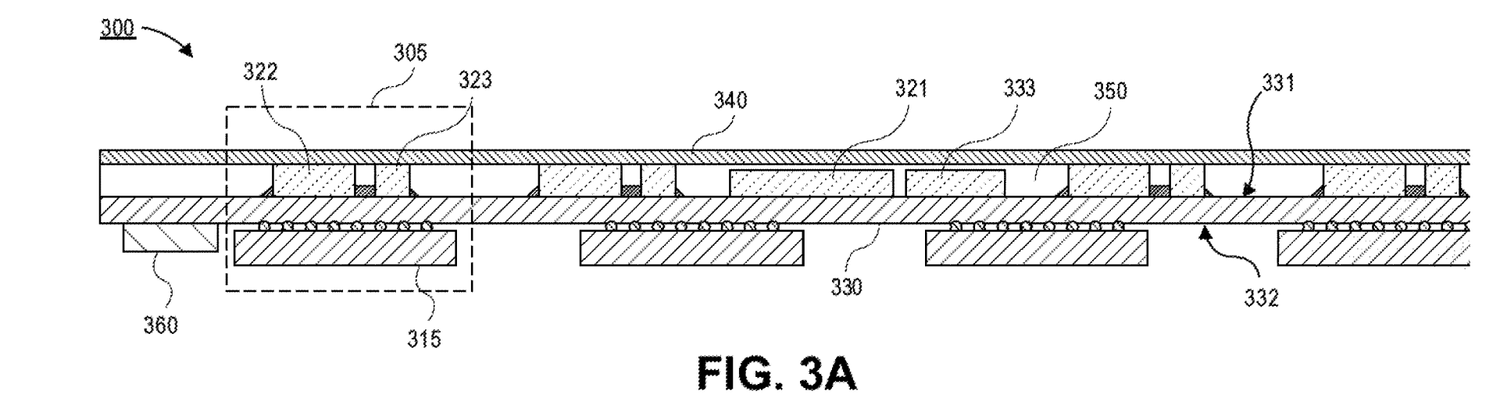
FIG. 3A is a cross-sectional illustration of an RF front end module with an amplifier die attached directly to a first surface of the first package substrate, in accordance with an embodiment.
Figure 3B:
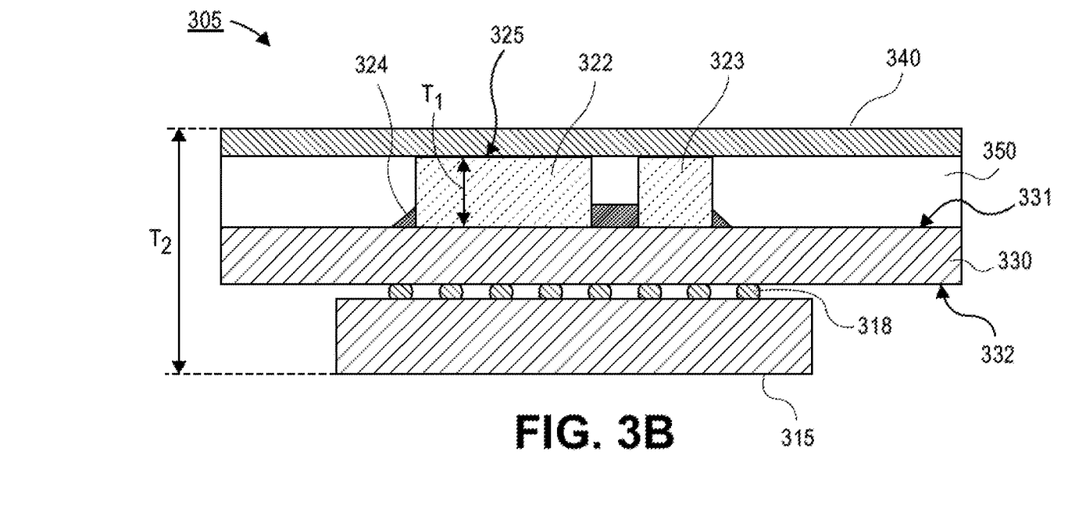
FIG. 3B is a zoomed in cross-sectional illustration of a portion of the RF front end module in FIG. 3A, in accordance with an embodiment.

Referring now to FIGS. 3A and 3B, a cross-sectional illustration of an RF front end module 300 and cross-sectional illustration of a portion 305 of the front end module 300 are shown, respectively, in accordance with an embodiment.

In an embodiment, the front end module 300 may comprise a first package substrate 330. In an embodiment, the first package substrate 330 may substantially similar to the first substrate 230 described above. In an embodiment, the first package substrate 330 may comprise a plurality of conductive traces and vias (not shown) as is known to those skilled in the art.

In an embodiment, an RF front end CMOS die 321 may be attached to a first surface 331 of the first package substrate 330 with first level interconnects (not shown) and an underfill material 324. In an embodiment, the RF front end CMOS die 321 may be substantially similar to the RF front end CMOS 221 described above. In an embodiment, one or more additional components 333 may be attached to the first surface 331 of the first package substrate 330. For example, the one or more additional components 333 may comprise active dies, discrete passives, or the like. In a particular embodiment, the additional component 333 may comprise an inductor.

In an embodiment, a connector 360 may be formed on a second surface 332 of the first package substrate 330. For example, the connector 360 may be a connector suitable for coupling the RF front end module 300 to an RF back end module (not shown) (e.g., by a flexible printed circuit (FPC), a coaxial cable, or the like).

In an embodiment, a mold layer 350 may be formed over the first surface 331 of the first package substrate 330. In an embodiment, the mold layer 350 may be substantially similar to the mold layer 250 described above. In an embodiment, the mold layer 350 may embed the front end CMOS die 321 and the component 333. In an embodiment, one or more of the front end CMOS die 321 and the component 333 may have exposed backside surfaces that interface with a heat spreader 340.

In an embodiment, an amplification die 322 may be attached to the first surface 331 of the first package substrate 330. In the illustrated embodiment, four amplification dies 322 are shown. However, it is to be appreciated that any number of amplification dies 322 may be attached to the first surface 331 of the first substrate 330. For example, the number of amplification dies 322 may match the number of antenna modules 315. In such an embodiment, each of the amplification dies 322 may be communicatively coupled with a different one of the antenna modules 315.

In an embodiment, the amplification die 322 may comprise amplification circuitry and a plurality of switches. In an embodiment, the amplification die 322 may be formed on any suitable semiconductor substrate. In a particular embodiment, the amplification die 322 may be formed on a different semiconductor substrate than the front end CMOS die 321. For example, the front end CMOS die 321 may be a silicon die and the amplification die 322 may be a III-V semiconductor die.

In an embodiment, the amplification dies 322 may each be attached to the first package substrate 330 by first level interconnects (not shown) and an underfill material 324. In an embodiment, a companion die 323 may also be attached to the first package substrate 330. Attaching the amplification dies 322 to the first package substrate 330 allows for the second package substrate to be omitted.

In an embodiment, the amplification dies 322 may be embedded within the mold layer 350. In some embodiments, the amplification dies 322 include an exposed backside surface 325 that is not covered by the mold layer 350. In such embodiments, the backside surface 325 may be in direct contact with the heat spreader 340. In some embodiments, a TIM (not shown) may be formed over the backside surface 325 to provide improved thermal contact between the heat spreader 340 and the amplification dies 322. As such, thermal performance is greatly improved since the length of the thermal pathway between the amplification dies 322 and the heat spreader is reduced.

Additionally, since the amplification dies 322 are not subject to stringent thickness restrictions, such as in the architecture described above where the amplification die is between the antenna module and the first package substrate, the amplification dies 322 may have a relatively large thickness $T_1$. For example, the thickness $T_1$ of the amplification dies 322 may be approximately 100 μm or greater, 150 μm or greater, or 300 μm or greater. Increasing the thickness $T_1$ of the amplification dies 322 improves the thermal performance and reduces likelihood of chipping or cracking the amplification dies 322.

In an embodiment, the amplification dies 322 may be positioned above and over the antenna module 315 to which the amplification die 322 is communicatively coupled. Particularly, the amplification die 322 may be within the perimeter of the antenna module 315 (i.e., within the perimeter of the antenna module 315, but at a different Z-height). Providing the amplification die 322 above and over the antenna module 315 provides a short path between the two components and minimizes losses. Furthermore, attaching the amplification dies 322 directly to the first package substrate 330 also decreases the distance between the amplification dies 322 and the antenna modules 315, thereby minimizing losses.

In an embodiment, the RF front end module 300 may comprise a plurality of antenna modules 315. While four antenna modules 315 are shown in FIG. 3A, it is to be appreciated that any number of antenna modules 315 may be used, depending on the needs of the device. In an embodiment, the antenna modules 315 may comprise antenna structures suitable for transmitting and/or receiving wireless signals. In a particular embodiment, the antenna modules 315 may be substantially similar to the antenna modules 215 described above.

In an embodiment, the antenna modules 315 may be attached to the second surface 332 of the first package substrate 330 with solder balls 318 or any other suitable interconnect architecture. In an embodiment, an underfill material (not shown) may be formed around the solder balls 318.

In an embodiment, the total package thickness $T_2$ may also be reduced compared to previously described architectures. Instead of having the second package substrate 316 adding to the thickness of the package, the thickness $T_1$ of the amplification dies 322 is hidden by the thickness of the RF front end CMOS 321 and/or the additional components 333. Accordingly, RF front end modules 300 in accordance with embodiments described herein may have a total thickness $T_2$ that is less than 2 mm or less than 1.8 mm.

Figure 3C:
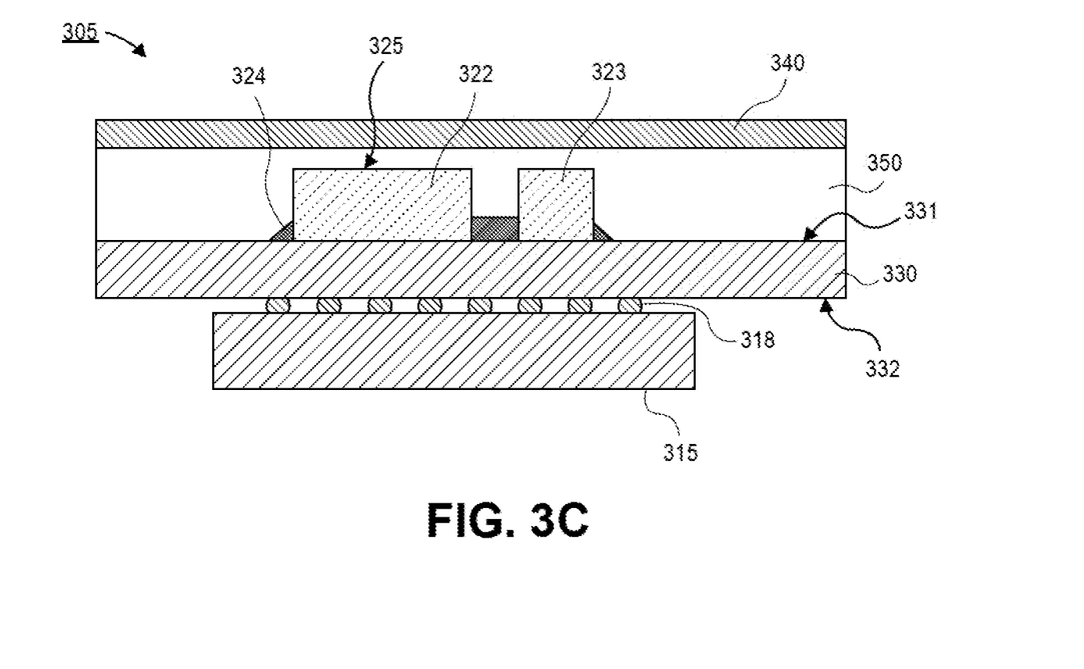
FIG. 3C is a zoomed in cross-sectional illustration of a portion of the RF front end module in FIG. 3A with an overmolded amplifier die, in accordance with an additional embodiment.

Referring now to FIG. 3C, a cross-sectional illustration of portion 305 is shown, in accordance with an additional embodiment. FIG. 3C is substantially similar to FIG. 3B, with the exception that the amplification die 322 is entirely embedded in the mold layer 350. That is, the backside surface 325 of the amplification die 322 is covered by the mold layer 350. While covering the backside surface 325 of the amplification die 322 with the mold layer may slightly decrease the thermal performance, the benefit lies in the simplification of the assembly process. For example, to provide an exposed die backside, the mold layer is formed and then ground back to expose the die backside. The grinding process is an additional process that decreases throughput. Furthermore, the grinding process is complicated with considerations such as warpage, and external pressures that may damage the system. Accordingly, some embodiments may include an over molded amplification die 322, as shown in FIG. 3C.

Figure 4:
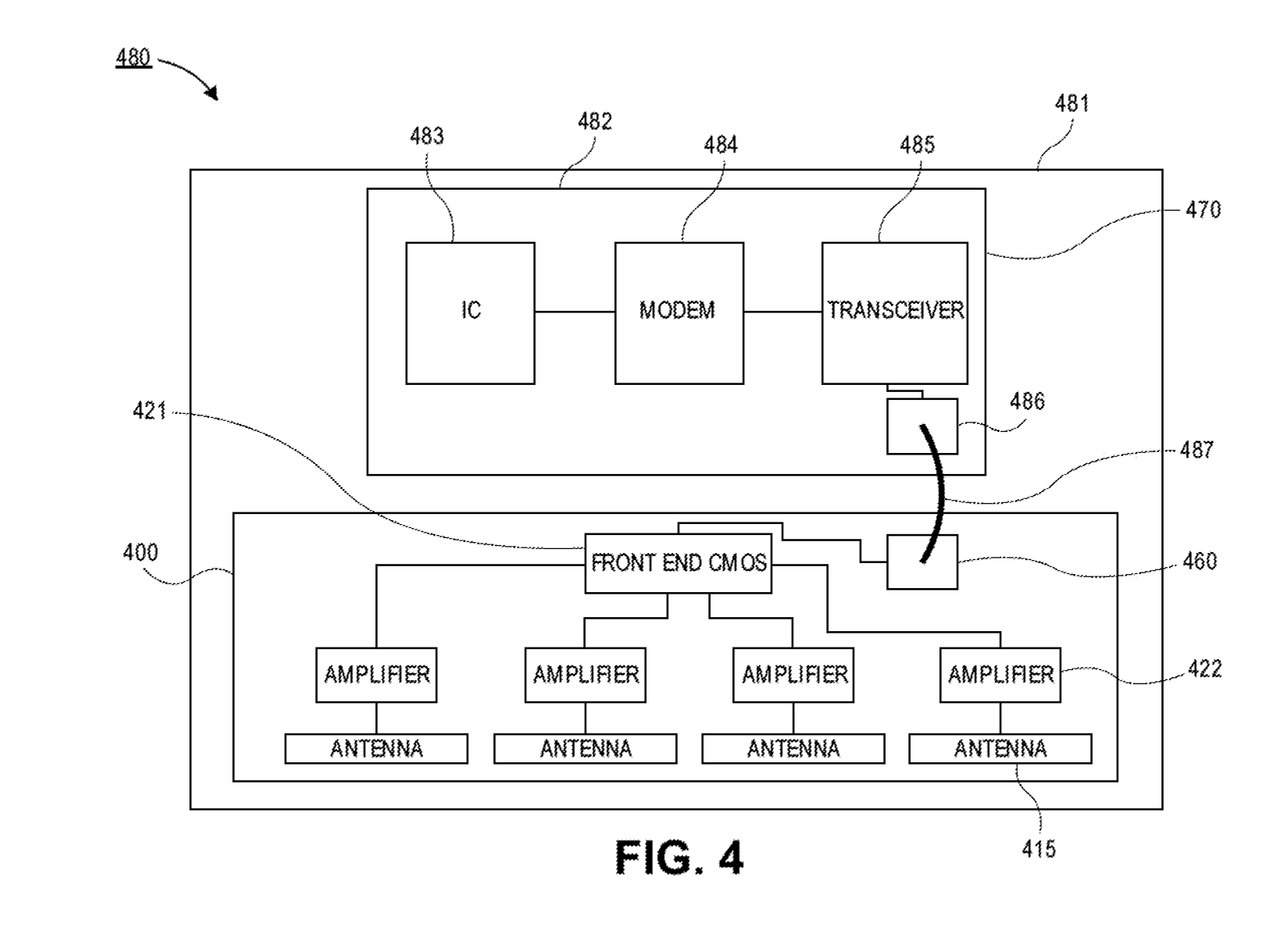
FIG. 4 is a schematic diagram of a communication module that comprises a remote RF front end module, in accordance with an embodiment.

Referring now to FIG. 4, a block diagram of a communication module 480 is shown, in accordance with an embodiment. In an embodiment, the communication module may comprise an RF back end module 470 and an RF front end module 400. In an embodiment, the RF back end module 470 and the RF front end module 400 may be communicatively coupled by a cable 487 that is attached to connectors 486 and 460. For example, the cable 487 may be an FPC, a coaxial cable, or the like.

In the illustrated embodiment, the RF back end module 470 may comprise a single board 482. In other embodiments, the components of the RF back end module 470 (e.g., an integrated circuit (IC) die 483, a modem 484, and a transceiver 485, etc.) may be formed on two or more boards. In the illustrated embodiment, the components of the RF front end module 400 (e.g., the front end CMOS 421, the amplifiers 422, the antennas 415, etc.) may be formed on a single package substrate 430 (similar to the embodiments described with respect to FIGS. 3A-3C). However, the RF front end module 400 may comprise additional package substrates (similar to the embodiments described above with respect to FIGS. 2A-2C). In an embodiment, the RF back end module 470 and the RF front end module 400 may be attached on a single board 481. Alternatively, the RF back end module 470 and the RF front end module 400 may be formed on different boards and/or attached to a housing of a computer system (e.g., a laptop, a cellular phone, a computer, a mobile device, or the like).

Figure 5:
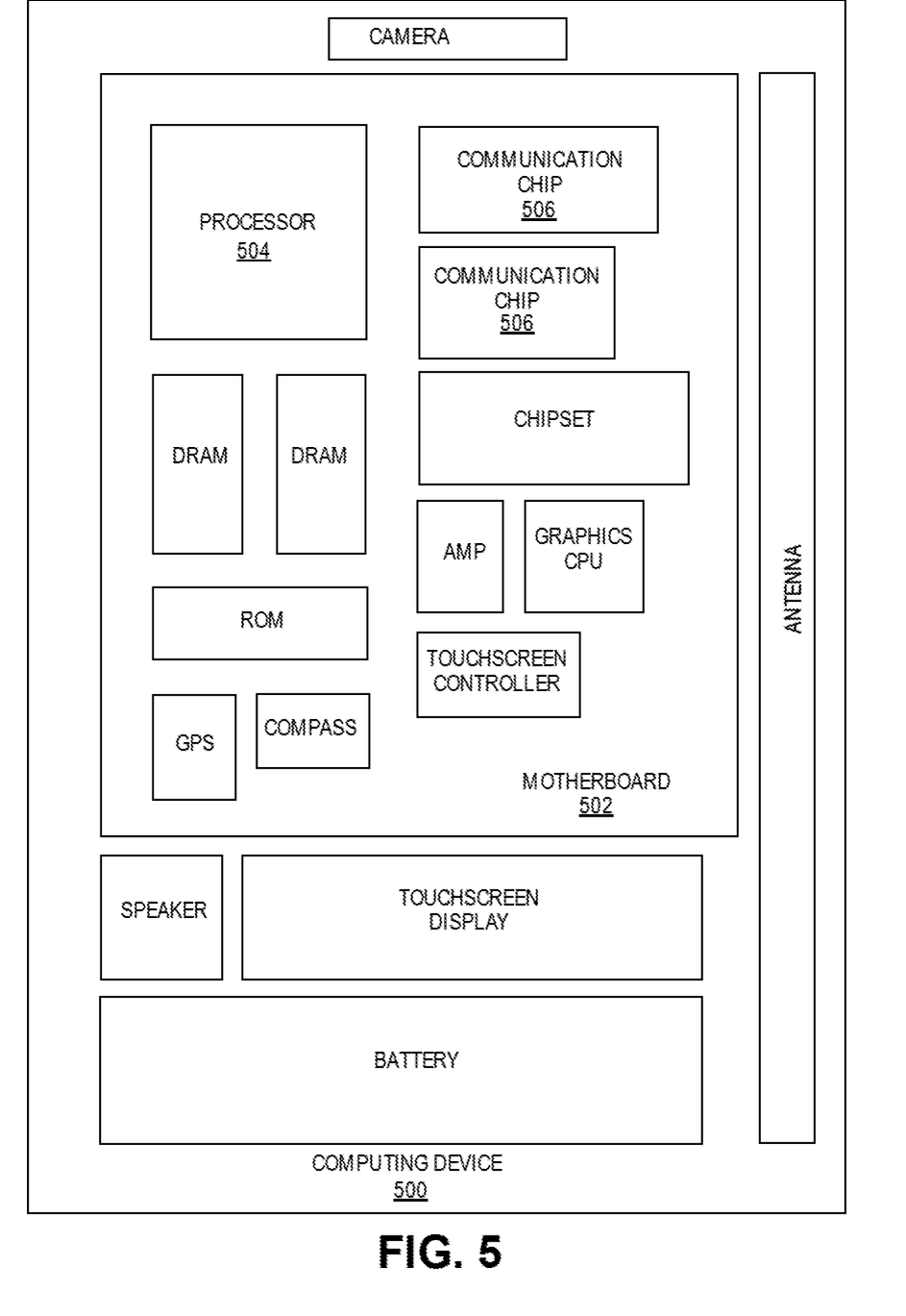
FIG. 5 is a schematic of a computing device built in accordance with an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor may be communicatively coupled to a remote RF front end, in accordance with embodiments described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip may be communicatively coupled to a remote RF front end, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a radio frequency (RF) front end, comprising: a package substrate; a first die attached to a first surface of the package substrate, wherein the first die comprises CMOS components; a second die attached to the first surface of the package substrate, wherein the second die comprises amplification circuitry; and an antenna attached to a second surface of the package substrate, wherein the second surface is opposite from the first surface.

Example 2: the RF front end of Example 1, wherein the second die is packaged on a second package substrate, wherein the second package substrate is attached to the first surface of the package substrate.

Example 3: the RF front end of Example 1 or Example 2, wherein the second die is directly attached to the first surface of the package substrate with a first level interconnect.

Example 4: the RF front end of Examples 1-3, further comprising: a mold layer over the first surface of the package substrate, wherein the first die and the second die are at least partially embedded in the mold layer.

Example 5: the RF front end of Examples 1-4, wherein a backside surface of the second die is exposed.

Example 6: the RF front end of Examples 1-5, wherein the second die is completely embedded in the mold layer.

Example 7: the RF front end of Examples 1-6, further comprising: a heat spreader formed over the mold layer.

Example 8: the RF front end of Examples 1-7, wherein a backside surface of the second die contacts the heat spreader.

Example 9: the RF front end of Examples 1-8, wherein the second die has a die thickness that is 200 µm or greater.

Example 10: the RF front end of Examples 1-9, wherein the second die is positioned directly above the antenna.

Example 11: the RF front end of Examples 1-10, further comprising: a plurality of antennas; and a plurality of second dies, wherein each of the second dies is electrically coupled to one of the antennas.

Example 12: the RF front end of Examples 1-11, wherein the antenna is a mm-wave antenna.

Example 13: a communication module, comprising: a processor die attached to a first package substrate; a modem die attached to the first package substrate; a transceiver die attached to the first package substrate; and a remote radio frequency (RF) front end attached to a second package substrate, wherein the second package substrate is communicatively coupled to the first package substrate, wherein the remote RF front end comprises: a first die attached to a first surface of the second package substrate, wherein the first die comprises CMOS components; a plurality of second dies attached to the first surface of the second package substrate, wherein the second dies comprise amplification circuitry; and a plurality of antennas attached to a second surface of the second package substrate, wherein the second surface is opposite from the first surface.

Example 14: the communication module of Example 13, wherein the first package is communicatively coupled to the second package by a cable.

Example 15: the communication module of Example 13 or Example 14, wherein the cable is a flexible printed circuit (FPC) cable or a coaxial cable.

Example 16: the communication module of Examples 13-15, wherein each of the second dies is communicatively coupled to different antennas, and wherein each second die is positioned over the antenna to which it is communicatively coupled.

Example 17: the communication module of Examples 13-16, wherein the second dies comprise RF amplification circuitry and a plurality of switches.

Example 18: the communication module of Examples 13-17, wherein the first die comprises circuitry for splitting RF signals, combining RF signals, and phase shifting RF signals.

Example 19: the communication module of Examples 13-18, wherein a Z-height of the remote RF front end is less than 2.0 mm.

Example 20: the communication module of Examples 13-19, wherein the remote RF front end further comprises: a mold layer over the first surface of the second package substrate; and a heat spreader over the mold layer.

Example 21: the communication module of Examples 13-20, wherein the plurality of second dies are completely embedded in the mold layer.

Example 22: the communication module of Examples 13-21, wherein the plurality of second dies contact the heat spreader.

Example 23: a computing system, comprising: a communication module for sending and receiving mm-wave signals, wherein the communication module comprises: a back end module; and a remote front end module, wherein the remote front end module comprises: a first die attached to a first surface of a package substrate, wherein the first die comprises CMOS components; a plurality of second dies attached to the first surface of the package substrate, wherein the second dies comprise amplification circuitry; a mold layer over the first surface of the package substrate; a heat spreader over the mold layer; and a plurality of antennas attached to a second surface of the package substrate, wherein the second surface is opposite from the first surface.

Example 24: the computing system of Example 23, wherein the plurality of second dies each contact the heat spreader.

Example 25: the computing system of Example 23 or Example 24, wherein the each of the plurality of second dies is communicatively coupled with different antennas, and wherein each of the plurality of second dies is positioned over the antenna to which it is communicatively coupled.

What is claimed is:

1. A radio frequency (RF) front end, comprising:
   a first package substrate;
   a first die coupled to a first surface of the first package substrate, wherein the first die comprises CMOS components;
   a second die coupled to the first surface of the first package substrate, wherein the second die comprises amplification circuitry, wherein the second die is separate and distinct from the first die, and wherein the first die and the second die are packaged on a second package substrate, the second package substrate attached to the first surface of the package substrate, and the second package substrate vertically between the first package substrate and the first and second dies; and
   an antenna attached to a second surface of the first package substrate, wherein the second surface is opposite from the first surface.

2. The RF front end of claim 1, further comprising:
   a mold layer over the first surface of the first package substrate, wherein the first die and the second die are at least partially embedded in the mold layer.

3. The RF front end of claim 2, wherein a backside surface of the second die is exposed.

4. The RF front end of claim 2, wherein the second die is completely embedded in the mold layer.

5. The RF front end of claim 2, further comprising:
   a heat spreader formed over the mold layer.

6. The RF front end of claim 5, wherein a backside surface of the second die contacts the heat spreader.

7. The RF front end of claim 1, wherein the second die has a die thickness that is 200 µm or greater.

8. The RF front end of claim 1, wherein the second die is positioned directly above the antenna.

9. The RF front end of claim 1, wherein the antenna is a mm-wave antenna.

* * * * *